United States Patent
John et al.

(10) Patent No.: US 7,704,838 B2
(45) Date of Patent: Apr. 27, 2010

(54) METHOD FOR FORMING AN INDEPENDENT BOTTOM GATE CONNECTION FOR BURIED INTERCONNECTION INCLUDING BOTTOM GATE OF A PLANAR DOUBLE GATE MOSFET

(75) Inventors: Jay P. John, Chandler, AZ (US); Thuy B. Dao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 316 days.

(21) Appl. No.: 11/510,401

(22) Filed: Aug. 25, 2006

(65) Prior Publication Data

US 2008/0050902 A1 Feb. 28, 2008

(51) Int. Cl.
*H01L 21/336* (2006.01)

(52) U.S. Cl. ............... 438/283; 438/157; 438/176; 257/E21.421

(58) Field of Classification Search .......... 438/157, 438/176, 283; 257/E21.421
See application file for complete search history.

(56) References Cited

U.S. PATENT DOCUMENTS

| | | | |
|---|---|---|---|
| 4,275,286 A * | 6/1981 | Hackett, Jr. ............. 219/121.2 |
| 5,461,250 A * | 10/1995 | Burghartz et al. ........... 257/347 |
| 6,339,002 B1 | 1/2002 | Chan et al. |
| 6,596,597 B2 * | 7/2003 | Furukawa et al. ........... 438/299 |
| 6,951,784 B1 | 10/2005 | Anderson et al. |
| 7,141,476 B2 * | 11/2006 | Dao ............................ 438/283 |
| 7,205,185 B2 * | 4/2007 | Dokumaci et al. .......... 438/197 |
| 7,341,915 B2 * | 3/2008 | Li et al. ...................... 438/283 |
| 2005/0127412 A1 | 6/2005 | Cohen et al. |
| 2005/0282318 A1 | 12/2005 | Dao |
| 2006/0022275 A1 | 2/2006 | Illicali et al. |
| 2006/0027881 A1 * | 2/2006 | Ilicali et al. ................ 257/401 |

OTHER PUBLICATIONS

Wolf et al., "Silicon Processing for the VLSI Era, vol. 1: Process Technology", 2nd ed., 2000, Lattice Press, pp. 666-667.*
Mathew, L. et al.; U.S. Appl. No. 11/419,304, filed May 19, 2006, entitled "Semiconductor Structure Pattern Formation"; Specification, claims, abstract, figures totaling 30 pages.

* cited by examiner

*Primary Examiner*—Alexander G Ghyka
*Assistant Examiner*—Leonard Chang
(74) *Attorney, Agent, or Firm*—John A. Fortkort; Fortkort & Houston P.C.

(57) ABSTRACT

A method is provided for making a semiconductor device, which comprises (a) providing a semiconductor structure comprising a top gate (228) and a bottom gate (240); (b) creating first, second and third openings in the semiconductor structure, wherein the first opening exposes a portion of the bottom gate; (c) filling the first, second and third openings with a conductive material, thereby forming source (258) and drain (260) regions in the second and third openings and a conductive region (253) in the first opening; and (d) forming an electrical contact (278) to the conductive region.

17 Claims, 10 Drawing Sheets

METHOD FOR FORMING AN INDEPENDENT BOTTOM GATE CONNECTION FOR BURIED INTERCONNECTION INCLUDING BOTTOM GATE OF A PLANAR DOUBLE GATE MOSFET

FIELD OF THE DISCLOSURE

The present invention relates generally to semiconductor devices, and, more particularly, to planar double gate semiconductor-on-insulator structures and methods of making the same.

BACKGROUND OF THE DISCLOSURE

As the semiconductor industry has continued to progress toward increasingly smaller devices, complementary metal-oxide-semiconductor (CMOS) circuits have become increasingly more highly integrated. Consequently, the individual devices which are combined to form CMOS circuits have become increasingly smaller. In some instances, the scaling down of these devices has created a need for new technologies, as existing technologies have run into fundamental limitations that prevent the devices from being scaled down any further.

For example, in conventional metal-oxide-silicon field effect transistor ("MOSFET") devices in which a gate controls a channel and the channel provides a path between a source region and a drain region of the device, the smaller dimensions of the channel may cause the source and drain regions to be too close to one another. As a result of the shortened distance, leakage current may flow between the source and drain regions. Additionally, the ability to control the gate may be decreased.

To address these issues, double gate field effect transistors and, in particular, fin-type field effect transistors (FinFETs), have been developed. FinFETs are capable of relatively high transconductance and improved short-channel effects, and include two gate conductors that surround a non-planarized channel. To produce the desired FinFET structure, a substrate is subjected to a complex manufacturing process that typically includes deposition, etching, and planarization steps which provide suitable conductor, semiconductor, and insulating layers and which form the appropriate components of the FinFET structures from these layers.

Although FinFETs have a number of desirable properties, they can also be relatively costly and time-consuming to produce. As a result, manufacturers have begun exploring the use of other types of double gate devices, such as, for example, planar double gate devices. Planar double gate devices typically include a top gate, a bottom gate, and a channel interposed therebetween.

DETAILED DESCRIPTION

While planar double gate devices may represent a less costly and time consuming alternative to FinFET devices for some applications, the fabrication of these devices is beset with its own challenges. In particular, current methods used in the art for forming contacts to both the source and drain regions of these devices, as well as to the bottom gate, often result in insufficient or open contacts. This issue may be appreciated with respect to FIGS. 1-3.

Figure 1:
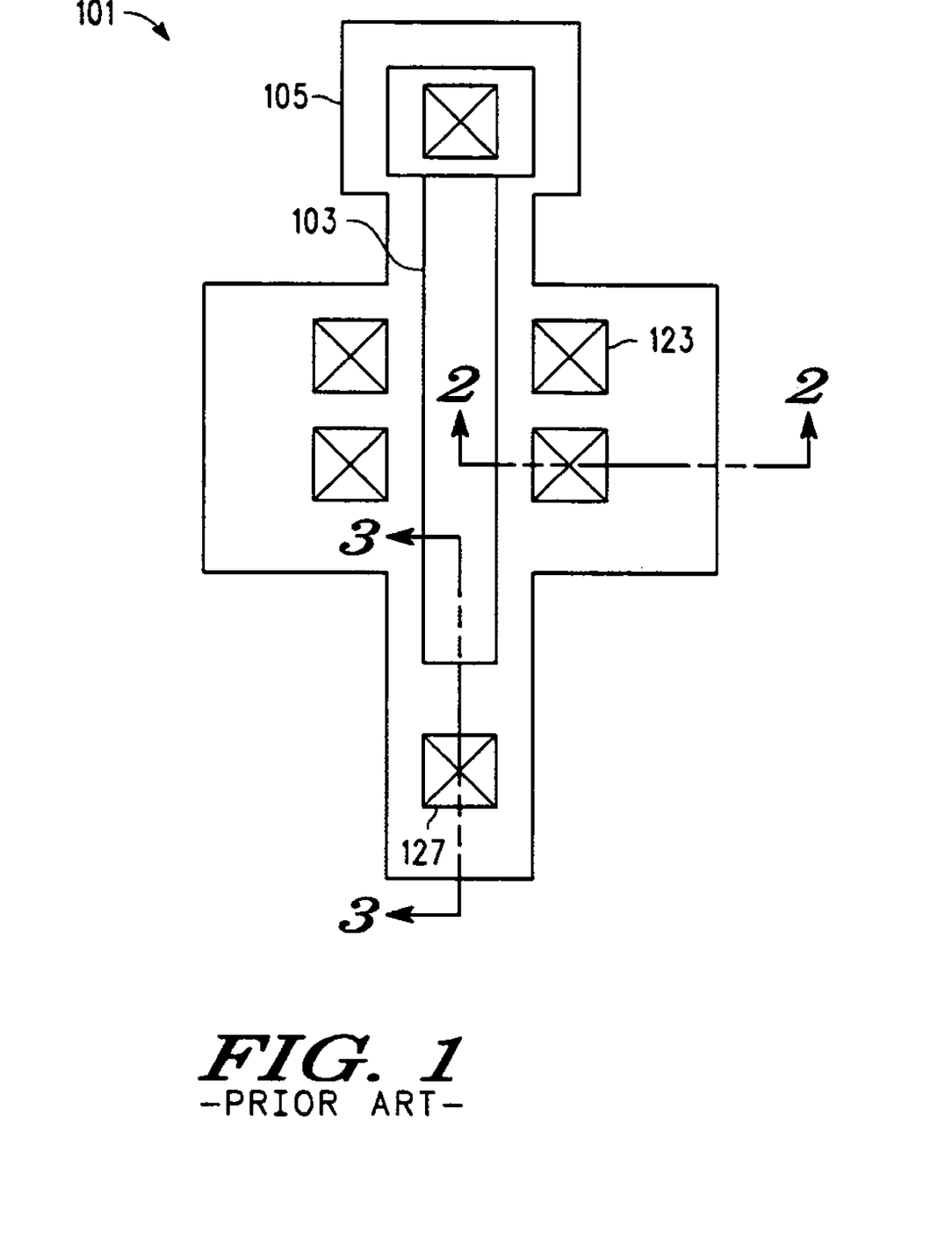
FIG. 1 is a top view of a prior art planar double gate MOSFET device.
Figure 2:
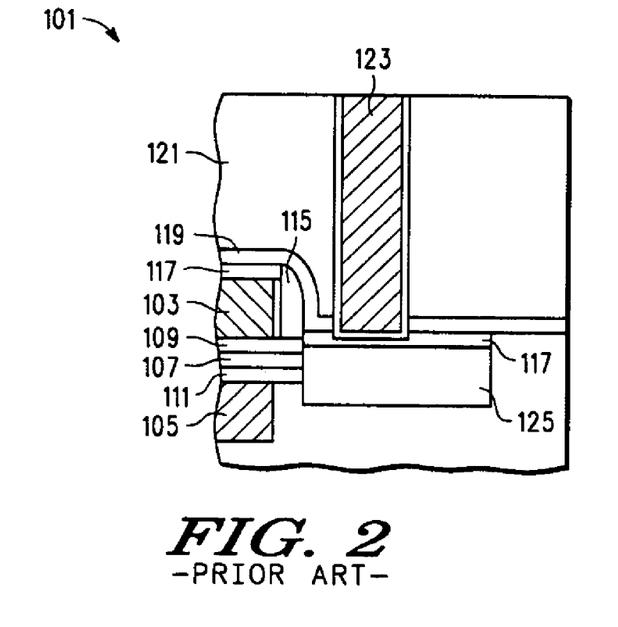
FIG. 2 is a cross-sectional view taken along LINE 2-2 of FIG. 1.
Figure 3:
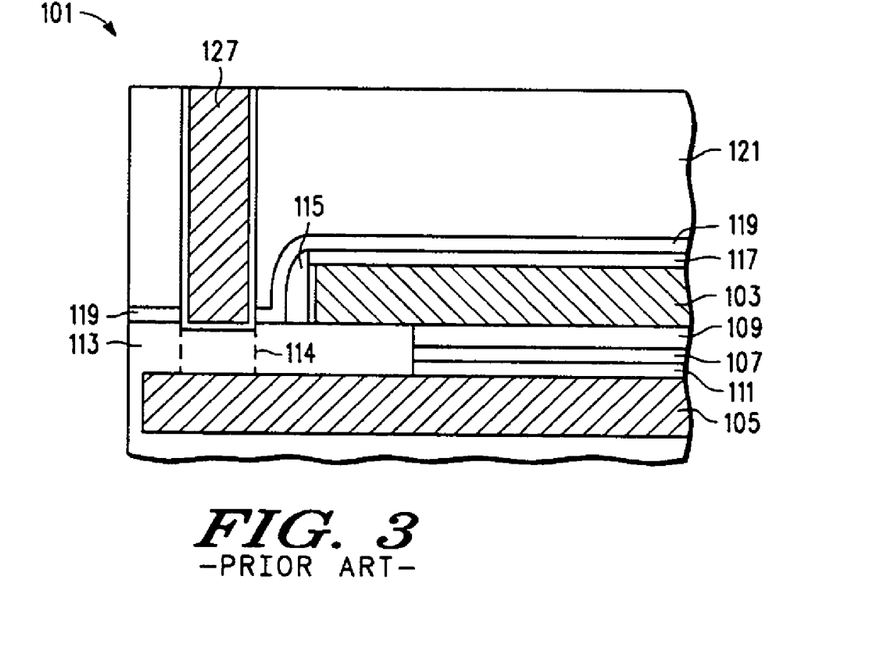
FIG. 3 is a cross-sectional view taken along LINE 3-3 of FIG. 1.

The structure shown in FIGS. 1-3 is a planar double gate MOSFET 101 (FIGS. 2 and 3 represent cross-sections of the MOSFET 101 taken along LINE 2-2 and LINE 3-3, respectively, of FIG. 1). As seen therein, the MOSFET 101 comprises a top gate 103 and a bottom gate 105 (see FIGS. 2-3) with a channel region 107 disposed between them and which is separated therefrom by a top gate oxide 109 and a bottom gate oxide 111, respectively.

As seen in FIG. 3, a portion of the top gate 103 and bottom gate 105 overlap and are separated from each other by a field oxide 113. The top gate 103 is provided with spacer structures 115 and a layer of silicide 117, over which is deposited a plasma enhanced nitride etch stop layer (PEN ESL) 119. An interlayer dielectric 121 is deposited over the PEN ESL 119. A contact 123 (see FIG. 2) is provided for the source/drain region 125 of the MOSFET 101. Similarly, a contact 127 (see FIG. 3) is provided for the bottom gate 105 of the MOSFET 101.

One problem that can arise in the fabrication of a device of the type depicted in FIGS. 1-3 concerns the formation of the contacts 123 and 127. As seen in FIG. 2, the upper surfaces of the source/drain region 125 are not coplanar with the upper surface of the bottom gate 105. Consequently, in order to form the contact 127 (see FIG. 3) to the bottom gate 105, the trench for that contact 127 must extend through an additional portion of the field oxide 113 as compared to the contact 123 (see FIG. 2) for the source/drain region 125. This frequently results in insufficient contact etching to reach the bottom gate, with the result that a portion of field oxide 113 remains between the contact 127 and the bottom gate 105 as shown in FIG. 3 (the dashed region 114 in the figure represents the originally targeted location of the contact). While this issue may be addressed with additional etching, such an approach may degrade the margin on the source/drain contact 123 which, in a conventional back end of line (BEOL) process, is attained with the PEN ESL 119.

There is thus a need in the art for methods and devices which address the aforementioned infirmities. In particular, there is a need in the art for a method for forming source/drain and bottom gate contacts which improve the contact process margins for etch stopping on the source/drain regions and bottom gates of a planar double gate MOSFET. There is further a need in the art for semiconductor structures in which contacts for the source/drain regions and the bottom gate can be made in essentially the same plane. These and other needs may be met by the devices and methodologies described herein.

In one aspect, a method for making a semiconductor device is provided. In accordance with the method, a semiconductor structure is provided which comprises a top gate and a bottom gate. First, second and third openings are then created in the semiconductor structure, wherein the first opening exposes a portion of the bottom gate. The first, second and third openings are then filled with a conductive material, thereby forming source and drain regions in the second and third openings and a conductive region in the first opening, after which an electrical contact is formed to the conductive region.

In another aspect, a semiconductor device is provided. The semiconductor device comprises a semiconductor structure having a top gate, a bottom gate, and source and drain regions, and a conductive region in electrical contact with the bottom gate, wherein the top of the conductive region is essentially coplanar with the tops of said source and drain regions.

These and other aspects of the present disclosure are described in greater detail below.

It has now been found that the aforementioned infirmities in the art may be overcome through an integrated fabrication process in which the source/drain regions of a planar double gate MOSFET are formed simultaneously with a bottom gate contact region such that the upper surfaces of the contact region and the source/drain regions are disposed at essentially the same vertical depth. Preferably, the process of forming contacts to these regions requires trenching through the same layers of the device. As a result, the contact etch required to form contacts to these regions is of the same, or nearly the same, duration, thereby preserving the contact process margins of the source/drain regions.

Figure 4:
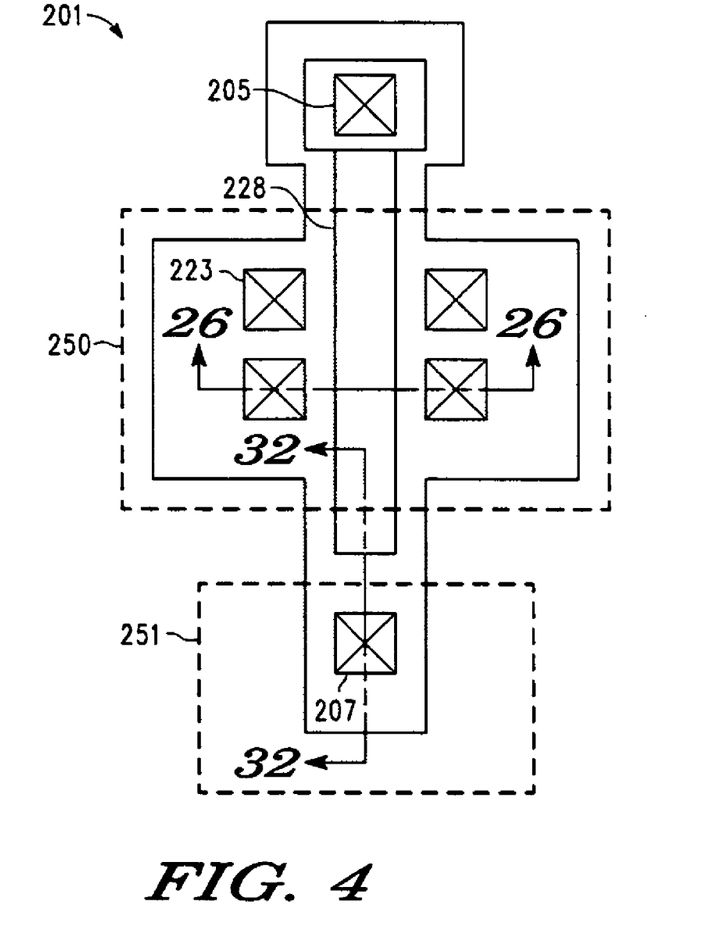
FIG. 4 is a top view of a particular, non-limiting embodiment of a planar double gate MOSFET device in accordance with the teachings herein.
Figure 26:
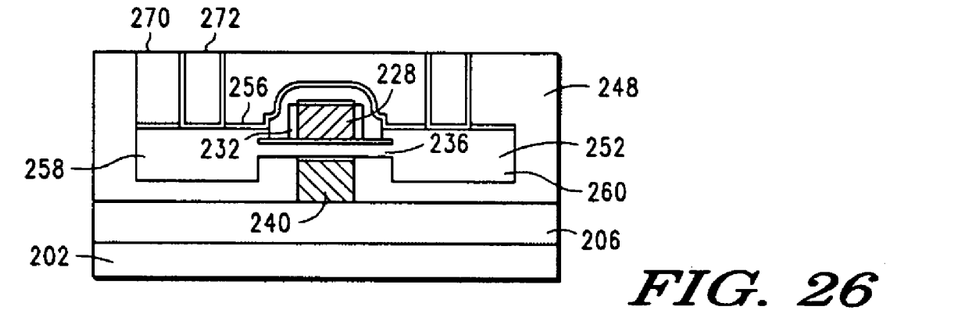
FIG. 26 is a step in a particular, non-limiting embodiment of the methodologies taught herein, and is the cross-section taken along LINE 26-26 of FIG. 4.
Figure 32:
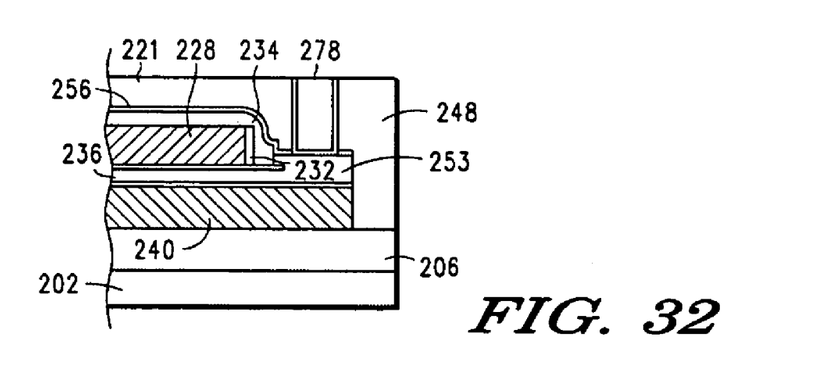
FIG. 32 is a step in a particular, non-limiting embodiment of the methodologies taught herein, and is the cross-section taken along LINE 32-32 of FIG. 4.

The methodologies described herein may be further understood with respect to the first particular, non-limiting embodiment depicted in FIG. 4, which may be further understood with reference to the cross-sections thereof that are depicted in FIGS. 26 and 32. The structure shown therein is a planar double gate MOSFET 201 comprising a top gate 228 and a bottom gate 240 (see FIGS. 26 and 32) with a channel region 236 disposed between them.

As seen in FIG. 32, a portion of the top gate 228 and bottom gate 240 overlap and are separated from each other by a channel layer 236. The top gate 228 is provided with hardmask structures 234 (and typically a layer of silicide (not shown)) over which is deposited a plasma enhanced nitride etch stop layer (PEN ESL) 256. An interlayer dielectric 221 is deposited over the PEN ESL 256. A contact 272 is provided for the source/drain regions 258 and 260 of the MOSFET 201 (see FIG. 26). Similarly, a contact 278 is provided for the bottom gate 240 of the MOSFET 201 (see FIG. 32).

Notably, a bottom gate contact region 253 has been provided which is in electrical contact with the bottom gate 240 such that the top surface of the bottom gate contact region 253 and the top surface of the source/drain regions 252 (see FIG. 26) are essentially coplanar. Consequently, the contact etch required to form contacts to these regions is of the same, or nearly the same, duration, thereby preserving the contact process margins of the source/drain regions and overcoming the insufficient contact etching issues that can be problematic in the approach depicted in FIGS. 1-3.

The process by which the device of FIG. 4 may be fabricated may be appreciated with respect to FIGS. 5-32. FIGS. 5-26 illustrate the fabrication process as seen in the plane taken along LINE 26-26 of FIG. 4, while FIGS. 27-32 illustrate the fabrication process as seen in the plane taken along LINE 32-32 of FIG. 4.

Figure 5:
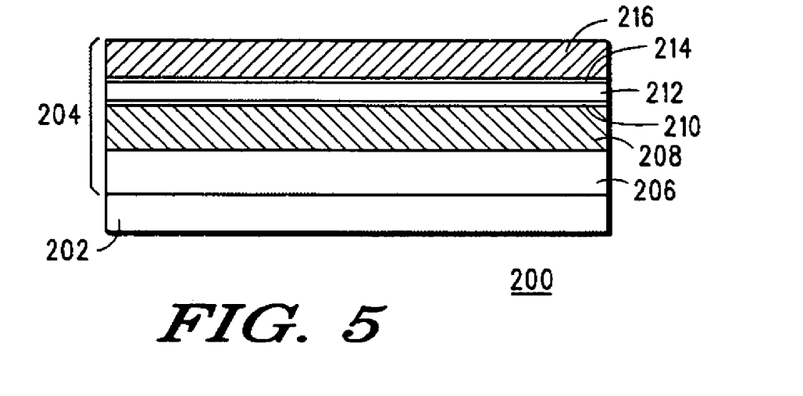
FIG. 5 is a step in a particular, non-limiting embodiment of the methodologies taught herein.

The method depicted therein begins with a wafer 200 that includes a substrate 202 and gate stack 204, as shown in FIG. 5. The substrate 202 may comprise mono-crystalline silicon, or other types of semiconductor materials as are known to the art, including, for example, silicon carbon, silicon germanium, germanium, type III/V semiconductor materials, type II/VI semiconductor materials, and combinations thereof. Substrate 202 may also comprise multiple layers of different semiconductor materials.

Gate stack 204 is disposed over substrate 202 and includes an insulator layer 206, a bottom gate layer 208, a bottom gate dielectric layer 210, a channel layer 212, a top gate dielectric layer 214, and a top gate layer 216. Each of these layers may be formed in any conventional manner. In one exemplary embodiment, an insulator material is placed over substrate 202 to form insulator layer 206. The insulator material may be disposed on the substrate 202 in any suitable manner including, for example, by deposition or epitaxial growth.

Additionally, it will be appreciated that any suitable dielectric material may be used to form insulator layer 206 including, but not limited to, conventionally used oxides, such as silicon oxide, nitrides, such as silicon nitride, or other materials, such as phosphorous silicate glass, fluorinated silicate glass, and/or any other dielectric material including high thermal, conductive dielectric materials. Moreover, substrate 202 may alternatively be the insulator material and may make up insulator layer 206. The insulator material is placed over, or is formed as part of, the substrate 202 at a suitable thickness, which is typically between about 10 nm and 1000 nm.

Next, material suitable for forming a gate is deposited over insulator layer 206 to form bottom gate layer 208. Suitable materials that may be used for this purpose include metals, which may be pure metals or metal alloys, and semiconductor materials. Examples of possible metals include, but are not limited to, tungsten, tungsten silicon, tungsten titanium nitride, titanium, titanium nitride, titanium silicon, titanium silicon nitride, tantalum, tantalum silicon, tantalum nitride, tantalum silicon nitride, molybdenum, and other metals or combinations thereof. Examples of possible semiconductor materials include, but are not limited to, doped or undoped amorphous silicon or polysilicon, silicon germanium, and germanium. The gate material may also comprise multiple layers of electrically conductive or semiconductor materials. Typically, bottom gate layer 208 is deposited to a thickness within the range of about 10 nm to about 1000 nm.

A dielectric material is then placed over insulator layer 206 to form bottom gate dielectric layer 210. The dielectric material may be any suitable material that acts as an insulator, such as, for example, silicon oxide or other dielectrics, including, for example, oxynitride, hafnium oxide, aluminum oxide, tantalum oxide, lanthanium oxide, hafnium oxynitride, iridium oxynitride and/or other high K dielectric materials. Bottom gate dielectric layer 210 may be formed by growth process, deposition processes, or through other suitable methods. Preferably, bottom gate dielectric layer 210 has a thickness within the range of about 0.01 nm to about 100 nm.

Next, a channel material is deposited over bottom gate dielectric layer 210 to form channel layer 212. The channel material may be a semiconductor material, such as silicon, silicon germanium, or germanium, and may be deposited, grown, or otherwise placed over bottom gate dielectric layer 210. Channel layer 212 will typically have a thickness within the range of about 1 nm to about 500 nm, and preferably has a thickness within the range of about 30 nm to about 90 nm.

Channel layer 212 is insulated from top gate 216 by top gate dielectric layer 214, the latter of which may be formed by deposition or growth processes. It will be appreciated that any one of numerous suitable materials may be employed in top gate dielectric layer 214, including any of those materials used to form bottom gate dielectric layer 210. The material of the top gate dielectric layer 214 may be the same or different from the material of the bottom gate dielectric layer 210. Preferably, top gate dielectric layer 214 has a thickness within the range of about 10 nm to about 120 nm.

Suitable gate material is then deposited over top gate dielectric layer 214 to form top gate layer 216. Top gate layer 216 may comprise any one of numerous suitable electrically conductive or semiconductor materials, including those materials used to form bottom gate layer 208. It will be appreciated that top gate layer 216 may or may not be formed of the same material than bottom gate layer 208. Top gate layer 216 preferably has a thickness within the range of about 10 nm to about 120 nm.

While the preceding paragraphs discuss the layer-by-layer fabrication of the wafer shown in FIG. 5, it will also be appreciated that this wafer may be formed by wafer bonding using a suitable handle wafer and donor wafer. A wafer bonding process suitable for this purpose is described in FIGS. 1-2 and the associated text of U.S. Ser. No. 10/871,402 (Dao). Top gate dielectric layer 214 may then be formed on the resulting structure through a suitable oxidation or growth process, followed by deposition of top gate layer 216.

Figure 6:
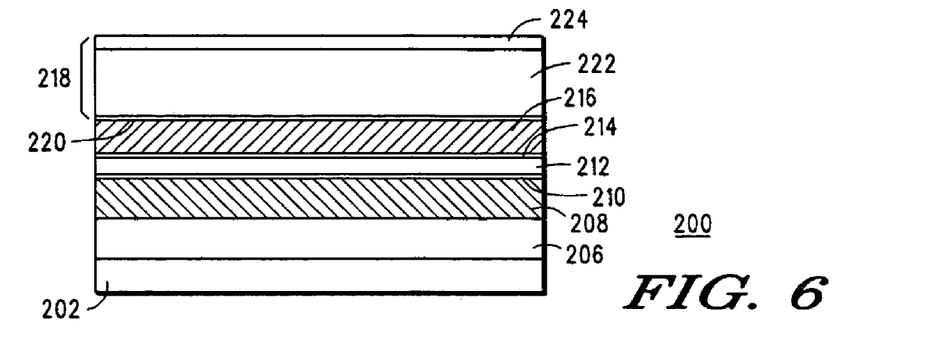
FIG. 6 is a step in a particular, non-limiting embodiment of the methodologies taught herein.

As shown in FIG. 6, after wafer 200 is obtained, a portion of top gate layer 216 is covered with a hard mask 218. Hard mask 218 protects top gate layer 216 during subsequent etch and planarization processes, and preferably comprises multiple layers 220, 222, and 224. First layer 220 and third layer 224 are preferably made from materials that differ from the material of second layer 222. The selection of each of the particular layer materials and deposition thicknesses of each layer may depend on the etch selectivities of the etchants to the various material layers in the following etching steps.

In one exemplary embodiment, both first and third layers 220 and 224 comprise a suitable oxide, including, but not limited to, TEOS. Preferably, first and third layers 220 and 224 comprise the same material. However, it will be appreciated that, in some embodiments, layers 220 and 224 may alternatively comprise different materials.

First layer 220 preferably has a thickness that is greater than the thickness of third layer 224. For example, first layer 220 may have a thickness of between about 1 nm and about 100 nm, and third layer 224 may have a thickness of between about 5 nm and about 100 nm, and preferably has a thickness that is about 10 nm less than that of first layer 220. Second layer 222 preferably comprises nitride, but may alternatively comprise any one of numerous other conventional materials suitable for protecting top gate layer 216, such as, for example, silicon dioxide. Second layer 222 preferably has a thickness that is greater than first and third layers 220 and 224. Thus, for example, the second layer may have a thickness within the range of about 10 nm to about 1000 nm. It will be appreciated that each of layers 220, 222, and 224 may be deposited or grown in any conventional manner.

Figure 7:
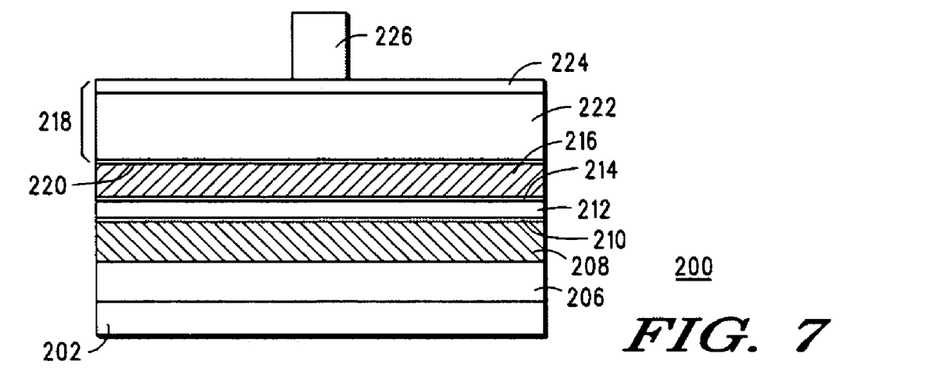
FIG. 7 is a step in a particular, non-limiting embodiment of the methodologies taught herein.
Figure 8:
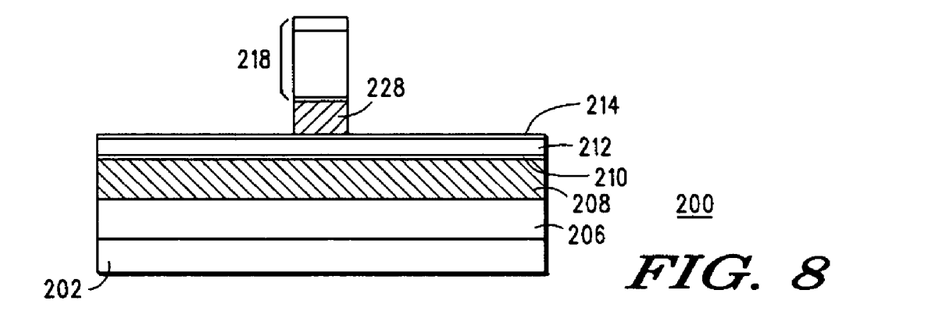
FIG. 8 is a step in a particular, non-limiting embodiment of the methodologies taught herein.

Next, a portion of hard mask 218 and top gate layer 216 are removed to form a top gate structure. One particular, non-limiting method of doing so is depicted in FIGS. 7 and 8. As shown in FIG. 7, a photoresist layer 226 is deposited over a selected portion of hard mask 218. Photoresist layer 226 may be placed over hard mask 218 in a predetermined pattern which may depend on the desired resultant shape of the top gate structure. Areas of hard mask 218 and top gate layer 216 that are not protected by photoresist layer 226 are removed by etching or through other suitable means. After photoresist layer 226 is removed, a top gate structure 228 having hard mask 218 remains, as shown in FIG. 8.

It will be appreciated that the aforementioned steps may be combined or performed in any other sequence that yields top gate structure 228 having hard mask 218 deposited thereover. For example, top gate structure 228 may first be formed on wafer 200 in any conventional manner. Then, hard mask 218 may be subsequently deposited over top gate structure 228 in any suitable manner. In any case, hard mask 218 covers at least a portion of top gate structure 228.

Figure 9:
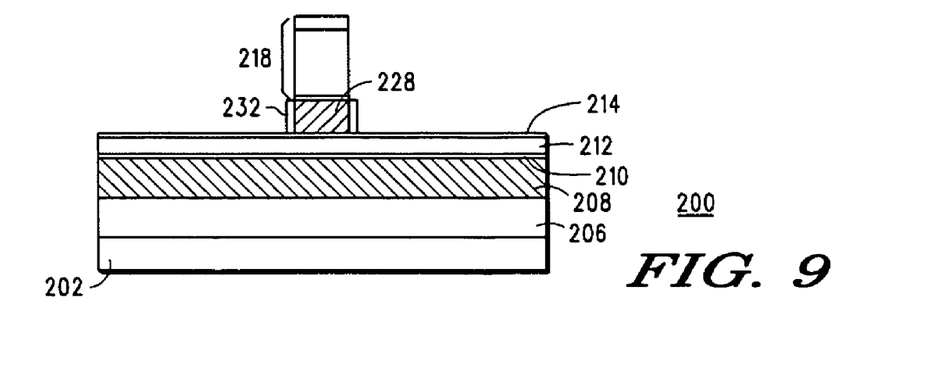
FIG. 9 is a step in a particular, non-limiting embodiment of the methodologies taught herein.
Figure 10:
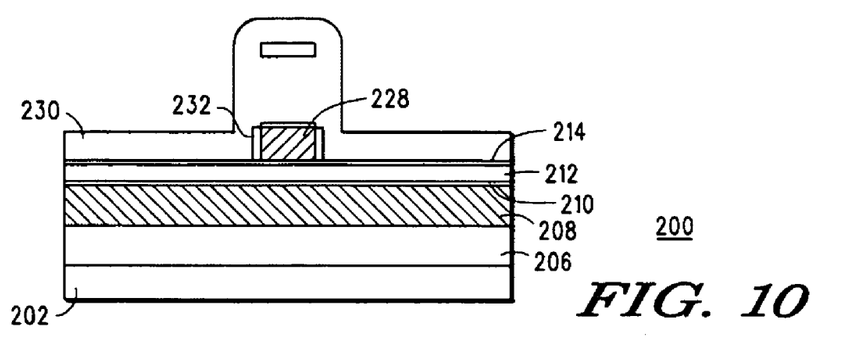
FIG. 10 is a step in a particular, non-limiting embodiment of the methodologies taught herein.
Figure 11:
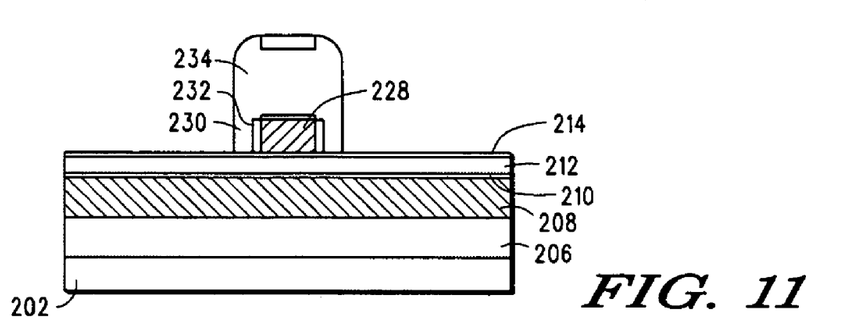
FIG. 11 is a step in a particular, non-limiting embodiment of the methodologies taught herein.

The top gate structure 228 is then encapsulated with an insulating material to form a spacer structure. One particular, non-limiting method for doing so is depicted in FIGS. 9-11. First, as shown in FIG. 9, a passivating layer 232 is deposited on exposed portions of top gate structure 228 to protect top gate structure 228 from subsequent processing. Various processes for depositing passivating layer 232 may be used for this purpose, including, but not limited to, rapid thermal processing or furnace oxidation processing.

Additionally, any suitable passivating material may be used. Typically, the specific selection of material and the manner in which the particular material is used are dependent on the material of the top gate structure 228. For example, if the top gate structure 228 material is polysilicon, an oxide may be used for passivating layer 232. In another example, if the top gate structure 228 material is metal, oxide may be employed. However passivating layer 232 may need to be formed by additional deposition and/or etching processes, instead of by a conventional furnace oxidation process. Any appropriate thickness of the passivating material may be deposited. For example, the passivating material may be deposited to a thickness between about 1 nm and about 30 nm.

As shown in FIG. 10, an insulating material 230 is then deposited over wafer 200. Preferably, insulating material 230 is deposited such that passivating layer 232 and top gate dielectric layer 214 are covered and a portion of hard mask 218 (and in particular, second layer 222 thereof; see FIG. 7) becomes incorporated as part of insulating material 230. In this regard, insulating material 230 and second layer 222 preferably comprise the same material. However, it will be appreciated that any suitable insulating material may alternatively be utilized. Insulating material 230 will preferably have a thickness within the range of about 30 nm to about 300 nm, and more preferably will have a thickness within the range of about 50 nm to about 150 nm.

Next, a portion of insulating material 230 is then selectively removed such that a dome-shaped hardmask 234 is formed around top gate structure 228 and a majority of top gate dielectric layer 214 is exposed, as shown in FIG. 11. Insulating material 230 may be removed in any suitable manner, such as, for example, by reactive ion etching. Hardmask 234 preferably has a desired thickness (from top gate structure 228 to an external periphery of insulating material 230) within the range of about 10 nm to about 500 nm.

Next, a channel structure is formed from channel layer 212. In a preferred embodiment, the channel structure has a length that is greater than the width of hardmask 234. In this regard, any one of numerous methods by which to form a suitable channel structure may be employed. One exemplary embodiment of such a method is shown in FIGS. 12-14.

Figure 12:
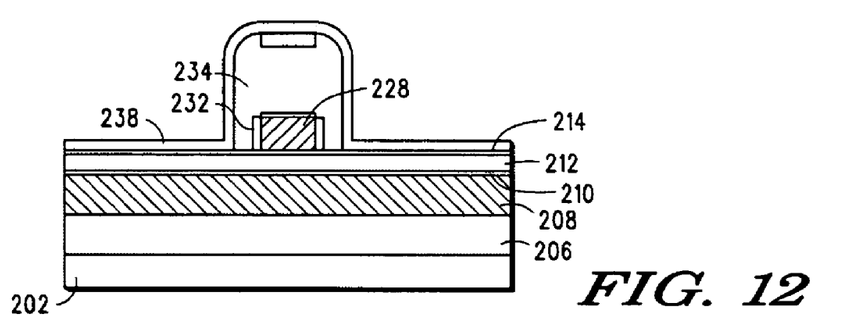
FIG. 12 is a step in a particular, non-limiting embodiment of the methodologies taught herein.

With reference to FIG. 12, a dielectric material is deposited or applied by a spin-on-process over channel layer 212 and the exposed surfaces of top gate dielectric layer 214 and hardmask 234 to form a dielectric layer 238 that merges with top gate dielectric layer 214. The dielectric material is preferably the same material as used for top gate dielectric layer 214, but may alternatively be any other suitable dielectric material.

Figure 13:
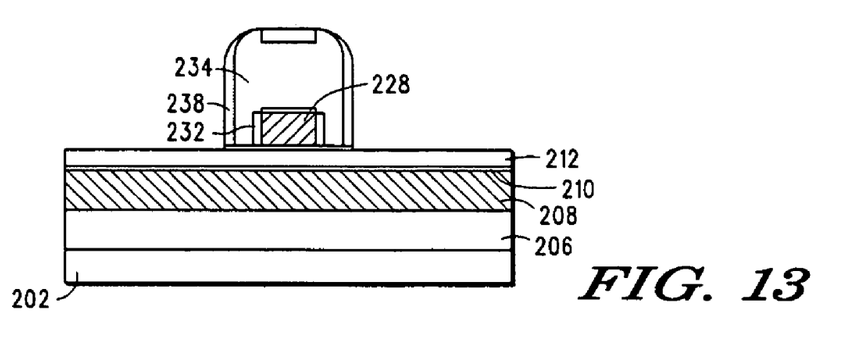
FIG. 13 is a step in a particular, non-limiting embodiment of the methodologies taught herein.
Figure 14:
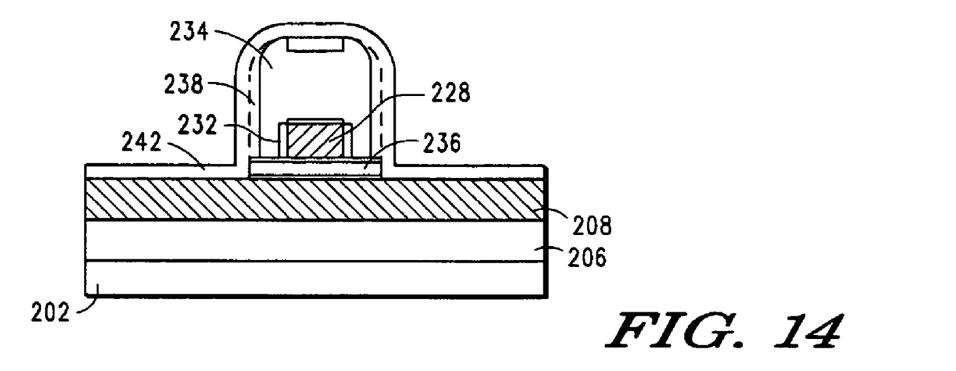
FIG. 14 is a step in a particular, non-limiting embodiment of the methodologies taught herein.

Next, the dielectric material that overlies channel layer 212 and that surrounds hardmask 234 is selectively removed, as shown in FIG. 13. It will be appreciated that any suitable method for removing the dielectric material may be used including, for example, masking techniques and reactive ion etching. Then, as shown in FIG. 14, a portion of channel layer 212 is removed (as, for example, through selective etching) to form channel structure 236.

After channel structure 236 is formed, a bottom gate structure that is substantially vertically in alignment with the top gate structure 228 is formed from bottom gate layer 208. The bottom gate structure may be formed using various methods, one particular, non-limiting embodiment of which is depicted in FIGS. 14-22.

As shown in FIG. 14, after channel structure 236 is formed, an insulating material 242 is deposited or applied by a spin-on-process over bottom gate layer 208 and over exposed surfaces of hardmask 234, channel structure 236, and dielectric layer 238. Insulating material 242 may comprise any suitable materials, such as oxides and, in particular, TEOS. Preferably, however, insulating material 242 has the same composition as dielectric layer 238 so that insulating material 242 and dielectric material 238 may merge with one another when insulating material 242 is deposited thereover. Insulating material 242 is typically deposited to a thickness of between about 10 nm and about 200 nm.

Figure 15:
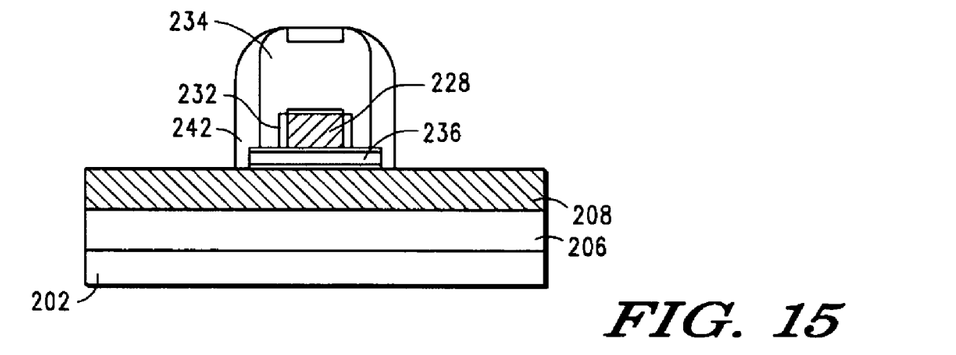
FIG. 15 is a step in a particular, non-limiting embodiment of the methodologies taught herein.
Figure 16:
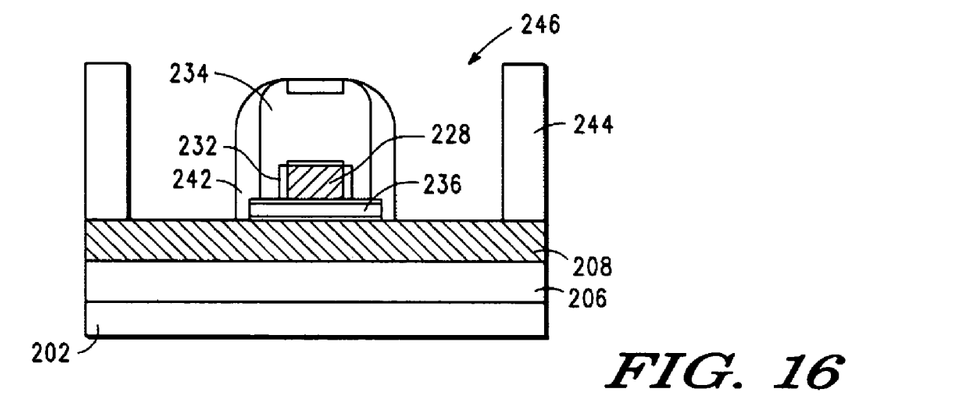
FIG. 16 is a step in a particular, non-limiting embodiment of the methodologies taught herein.

Turning now to FIG. 15, a first portion of insulating material 242 is selectively removed to expose a portion of bottom gate layer 208, while hardmask 234 and channel structure 236 remain encapsulated by insulating material 242. In one embodiment, as shown in FIG. 16, in order to isolate active areas on which further processing may occur from other non-active areas, a suitable photoresist 244 may be coated over the non-active areas to form an active cavity 246.

Figure 17:
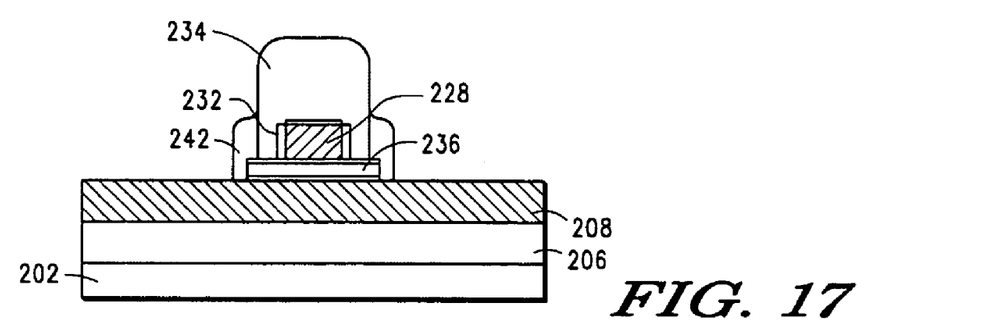
FIG. 17 is a step in a particular, non-limiting embodiment of the methodologies taught herein.

Next, a portion of insulating material 242 is removed such that the remaining insulating material 242 has a height that is substantially equal to a total height of channel structure 236 and top gate structure 228, as illustrated in FIG. 17. This step may be performed using any suitable process, including, but not limited to, selective etching or electrochemical planarization. In another exemplary embodiment, a portion of hardmask 234 is removed along with the aforementioned insulating material 242. In such case, etching compositions selective for insulating material 242 and hardmask 234 are utilized for etching.

Figure 18:
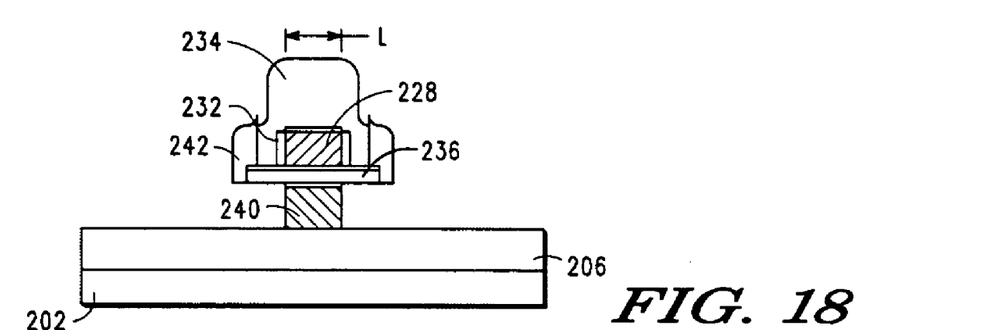
FIG. 18 is a step in a particular, non-limiting embodiment of the methodologies taught herein.

Next, as shown in FIG. 18, bottom gate structure 240 is formed. In one exemplary embodiment, an anisotropic dry etching process is first employed to vertically etch bottom gate layer 208. Then, an isotropic dry etching process is utilized to laterally etch bottom gate layer 208 until bottom gate structure 240 is formed such that it is substantially vertically aligned with, and having substantially the same width (in this plane of the device) as, the width L of top gate structure 228. In forming bottom gate structure 240, any combination of anisotropic dry etch and/or isotropic wet or dry etch processes may be utilized. It will be appreciated that any other suitable manner may be employed to form bottom gate structure 240 as well.

Next, a semiconductor material or insulator material is then deposited around bottom gate structure 240 and hardmask 234 and in contact with channel structure 236. This may be achieved using various processes, one particular, non-limiting example of which is shown in FIGS. 19-23.

Figure 19:
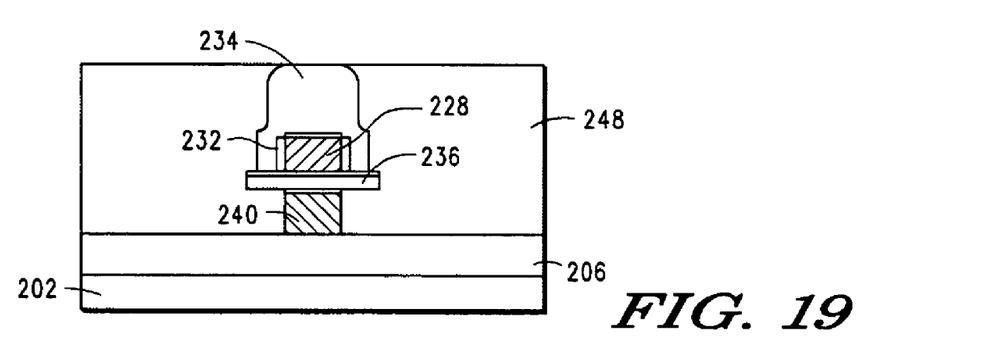
FIG. 19 is a step in a particular, non-limiting embodiment of the methodologies taught herein.

Turning to FIG. 19, in a first step of the exemplary embodiment, an insulating material 248 (preferably substantially similar to insulating material 242) is deposited around bottom gate structure 240 so as to cover hardmask 234 and exposed portions of channel structure 236. Insulating material 248, which may be a field oxide, is then planarized, as through chemical mechanical polishing (CMP), until a top of the hardmask 234 is exposed.

Figure 20:
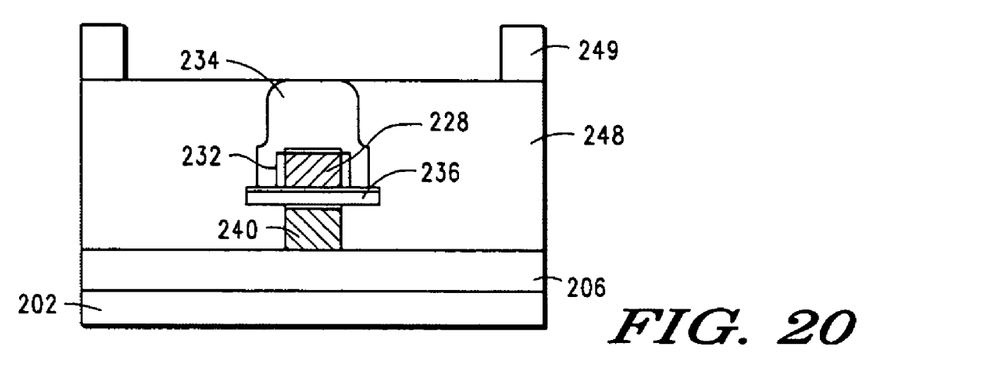
FIG. 20 is a step in a particular, non-limiting embodiment of the methodologies taught herein.
Figure 21:
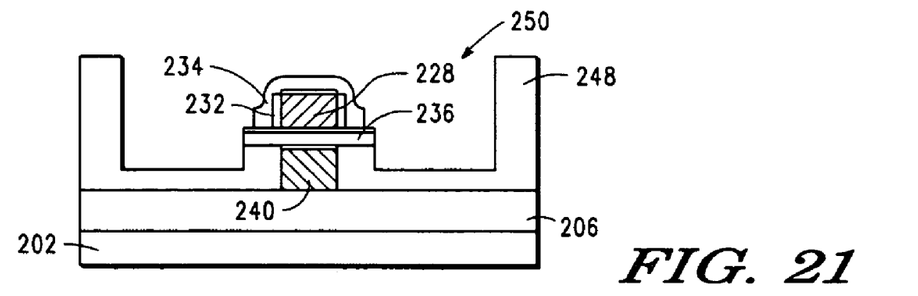
FIG. 21 is a step in a particular, non-limiting embodiment of the methodologies taught herein.

A photoresist layer 249 is deposited over selected portions of insulating material 248, as shown in FIG. 20. Next, the portion of insulating material 248 not covered by photoresist layer 249 is removed to expose hardmask 234 and edges of channel structure 236 to form a cavity 250, as shown in FIG. 21 (FIG. 4 shows a top view of this cavity). Preferably, insulating material 248 around bottom gate structure 240 and under the channel structure 236 remains. Subsequently, the photoresist layer 249 is stripped.

Figure 22:
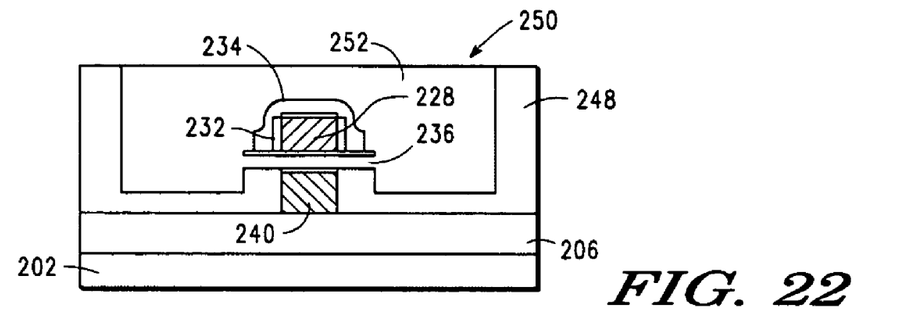
FIG. 22 is a step in a particular, non-limiting embodiment of the methodologies taught herein.
Figure 23:
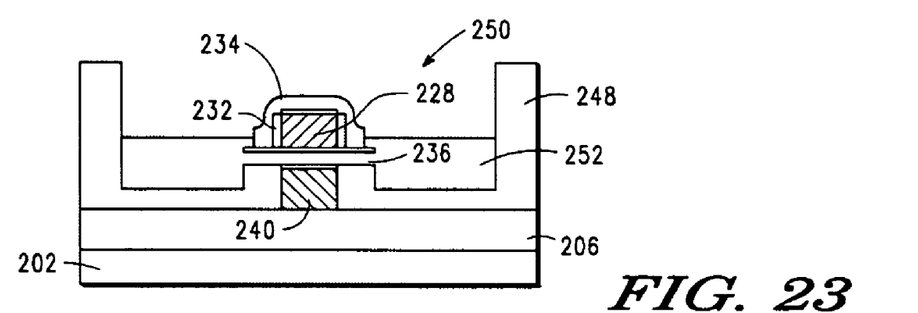
FIG. 23 is a step in a particular, non-limiting embodiment of the methodologies taught herein.
Figure 24:
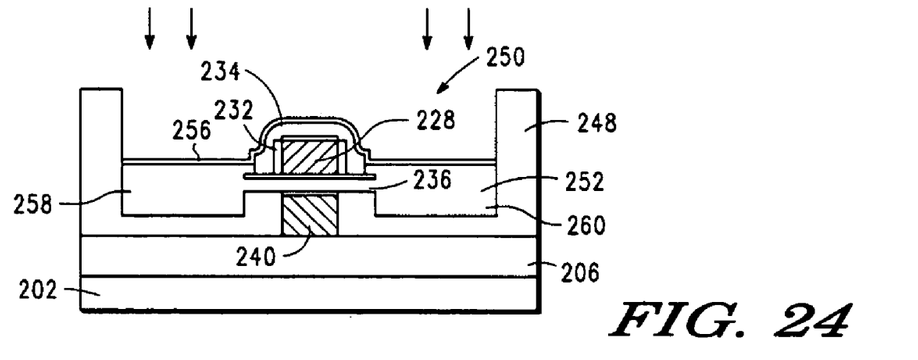
FIG. 24 is a step in a particular, non-limiting embodiment of the methodologies taught herein.

Next, cavity 250 is transformed into a source/drain cavity. Various processes may be used for this purpose, one particular, non-limiting embodiment of which is depicted in FIGS. 22-24. Turning to FIG. 22, a semiconductor material 252 is deposited into cavity 250 and is subsequently planarized (as, for example, through CMP) to produce a smooth surface. Semiconductor material 252 may be deposited in cavity 250 in any conventional manner and may, alternatively, be epitaxially grown.

Semiconductor material 252 is preferably the same material from which channel structure 236 is made. However, semiconductor material 252 may alternatively be any type of other suitable material, such as, for example, polysilicon, silicon, or metal, that can be used as source/drain contacts for the semiconductor device. The polysilicon or silicon may be doped or undoped with suitable source/drain dopants as is known to the art.

Then, a portion of semiconductor material 252 is removed to expose hardmask 234, as shown in FIG. 23. In a preferred embodiment, a bottom section of hardmask 234 remains surrounded by semiconductor material 252. Various processes may be employed for this purpose, including, but not limited to, selective etching, anisotropic dry etching, isotropic wet etching, or planarization. Alternatively, cavity 250 may be transformed into a source/drain cavity by epitaxially growing semiconductor material 252 off of channel structure 236.

Next, if not already present, source/drain dopants are implanted into the semiconductor material. In one particular, non-limiting embodiment shown in FIG. 24, a passivating layer 256 is deposited at a desired thickness to coat top gate structure 228 and semiconductor material 252 prior to doping. Passivating layer 256 may be any one of numerous suitable materials for protecting top gate structure 228 and semiconductor material 252 from subsequent processing, and may be deposited in any suitable manner.

In another particular, non-limiting embodiment, after passivating layer 256 is deposited, a source/drain spacer is formed over passivating layer 256. In yet another particular, non-limiting embodiment, material for forming a source/drain spacer is deposited over top gate structure 228 and semiconductor material 252, and a source/drain spacer is formed from the deposited material. It will be appreciated that whether a passivating layer is deposited or whether a source/drain spacer is formed may depend upon the particular purpose of the resulting device. In any case, source/drain implants are made in semiconductor material 252 for forming source/drain regions 258 and 260, as shown in FIG. 24. It will be appreciated that source/drain regions 258 and 260 may be implanted in any conventional manner.

Figure 25:
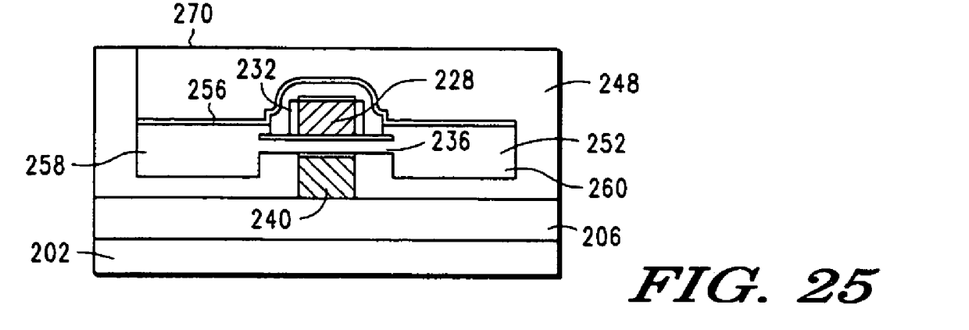
FIG. 25 is a step in a particular, non-limiting embodiment of the methodologies taught herein.

With reference to FIG. 25, an appropriate interlayer dielectric (ILD) 270 is deposited over the structure. The ILD 270 may be appropriately planarized after deposition. Source/drain contacts 272 are then formed as shown in FIG. 26 by forming suitable trenches through the ILD 270, and then backfilling the trenches with a suitable conductive material.

The formation of the contact to the bottom gate may be understood with reference to FIGS. 27-32, which represent cross-sectional views taken along LNE 32-32 of FIG. 4. FIGS. 27-32 correspond to the processing steps illustrated in FIGS. 21-26, respectively.

Figure 27:
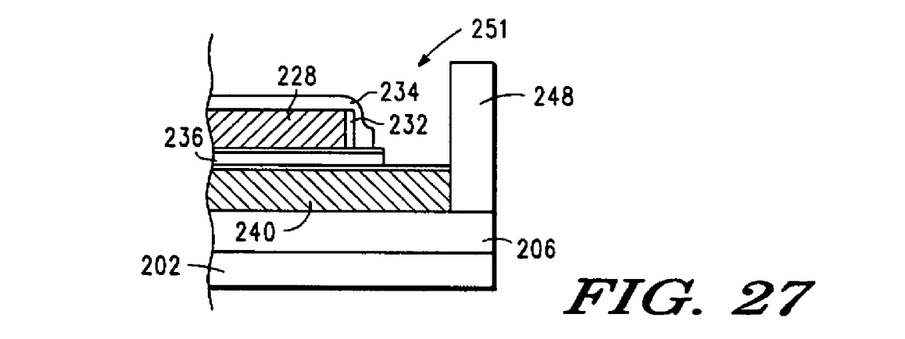
FIG. 27 is a step in a particular, non-limiting embodiment of the methodologies taught herein.
Figure 28:
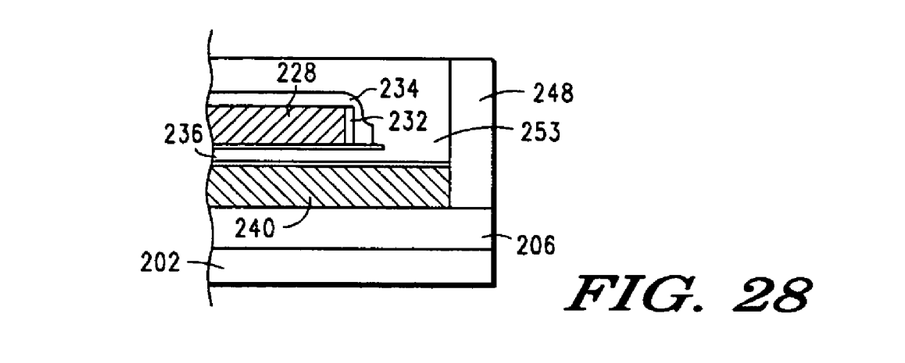
FIG. 28 is a step in a particular, non-limiting embodiment of the methodologies taught herein.
Figure 29:
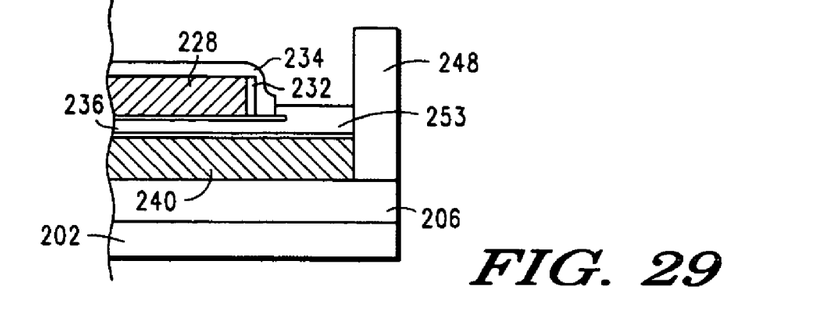
FIG. 29 is a step in a particular, non-limiting embodiment of the methodologies taught herein.
Figure 30:
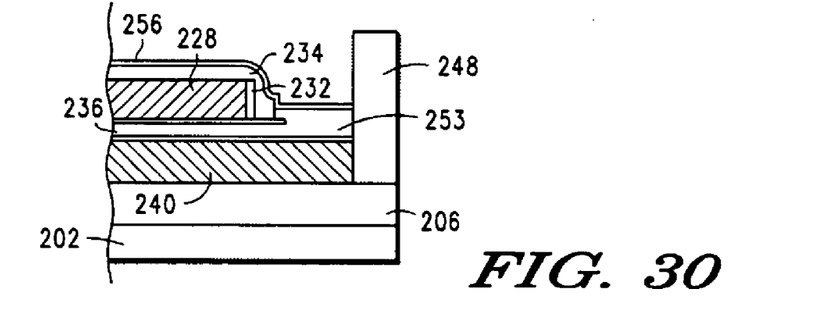
FIG. 30 is a step in a particular, non-limiting embodiment of the methodologies taught herein.
Figure 31:
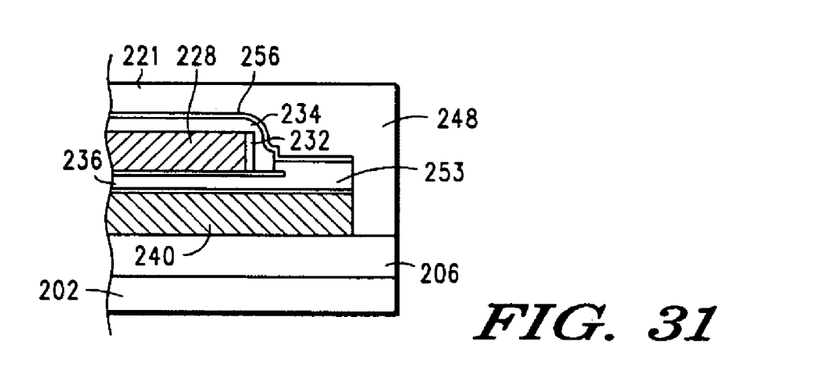
FIG. 31 is a step in a particular, non-limiting embodiment of the methodologies taught herein.

As seen therein, the semiconductor material 252 from which the source/drain regions 258 and 260 of the device are defined is also utilized to form contact regions 253 to the bottom gate 240. This is accomplished by forming a cavity 251 as shown in FIG. 27 (FIG. 4 shows a top view of this cavity) through removal of a portion of insulating material 248. Preferably, cavity 251 is formed simultaneously with cavity 250, though it may also be formed subsequently thereto through the use of a suitable masking and etching sequence. Semiconductor material 252 is then deposited (or grown) in cavity 251 (preferably as part of the same processing step in which semiconductor material 252 is deposited or grown in cavity 250). Semiconductor material 252 is subsequently planarized (as, for example, through CMP) to produce a smooth surface, preferably as part of the process used to planarize semiconductor material 252 in cavity 250.

Since both the bottom gate contact regions 253 and the source/drain regions 258 and 260 are formed from the same layer of semiconductor material 252 and are preferably planarized in the same process, the contacts 278 for the bottom gate contact regions 253 and the source/drain regions 258 and 260 are at the same depth. Hence, the problems in the art relating to insufficient contact etching to reach the bottom gate are overcome.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
    providing a semiconductor structure comprising a top gate and a bottom gate;
    creating first, second and third openings of essentially equal depth in the semiconductor structure, wherein the first opening exposes a portion of the bottom gate;
    filling the first, second and third openings with a conductive material, thereby forming source and drain regions in the second and third openings and a conductive region in the first opening; and,
    forming an electrical contact to the conductive region;
    wherein the conductive region and the source and drain regions comprise polysilicon from the same layer.

2. The method of claim 1, wherein the step of forming an electrical contact to the conductive region includes forming electrical contacts to the source and drain regions.

3. The method of claim 1, wherein the first, second and third openings are formed simultaneously.

4. The method of claim 3, wherein the first, second and third openings are formed through the use of reactive ion etching in combination with an etch mask.

5. The method of claim 1, wherein the step of filling the first, second and third openings comprises a deposition process.

6. The method of claim 5 wherein, after the first, second and third openings are filled with the deposition material, the device is subjected to an etch back such that the exposed surface of the deposition material in the first, second and third openings is essentially coplanar.

7. The method of claim 1, wherein the step of filling the first, second and third openings comprises an epitaxial growth process.

8. The method of claim 7 wherein, after the first, second and third openings are filled with the growth material, the device is subjected to an etch back such that the exposed surface of the growth material in the first, second and third openings is essentially coplanar.

9. The method of claim 1, wherein the semiconductor structure further comprises a field oxide region, and wherein the first opening extends through the field oxide region.

10. The method of claim 1, wherein the semiconductor device is a planar double gate MOSFET.

11. The method of claim 1, further comprising the step of forming an electrical contact to the source and drain regions.

12. The method of claim 1, wherein the top of said conductive region is essentially planar.

13. The method of claim 1, wherein the tops of said source and drain regions are essentially planar.

14. The method of claim 1, wherein the conductive region comprises polysilicon.

15. The method of claim 1, further comprising forming first, second and third electrical contacts, wherein said first contact is in electrical contact with the conductive region, and wherein said second and third contacts are in electrical contact with the source and drain regions, respectively.

16. The method of claim 15, wherein said first, second and third contacts are of essentially equal length.

17. The method of claim 1, wherein the first, second and third openings are filled with the same conductive material.

* * * * *